(12) United States Patent
Meiser et al.

(10) Patent No.: US 10,032,878 B2
(45) Date of Patent: Jul. 24, 2018

(54) SEMICONDUCTOR DEVICE WITH A SEMICONDUCTOR VIA AND LATERALLY CONNECTED ELECTRODE

(75) Inventors: Andreas Peter Meiser, Sauerlach (DE); Markus Zundel, Egmating (DE)

(73) Assignee: Infineon Technologies AG, Neubiberg (DE)

( * ) Notice: Subject to any disclaimer, the term of this patent is extended or adjusted under 35 U.S.C. 154(b) by 502 days.

(21) Appl. No.: 13/241,771

(22) Filed: Sep. 23, 2011

(65) Prior Publication Data
US 2013/0075814 A1    Mar. 28, 2013

(51) Int. Cl.
| H01L 29/66 | (2006.01) |
| H01L 29/423 | (2006.01) |
| H01L 23/48 | (2006.01) |
| H01L 21/768 | (2006.01) |
| H01L 21/74 | (2006.01) |
| H01L 29/739 | (2006.01) |
| H01L 29/78 | (2006.01) |
| H01L 29/40 | (2006.01) |

(52) U.S. Cl.
CPC ........ *H01L 29/4238* (2013.01); *H01L 21/743* (2013.01); *H01L 21/76898* (2013.01); *H01L 23/481* (2013.01); *H01L 29/4236* (2013.01); *H01L 29/66348* (2013.01); *H01L 29/66734* (2013.01); *H01L 29/7397* (2013.01); *H01L 29/7811* (2013.01); *H01L 29/7813* (2013.01); *H01L 29/407* (2013.01); *H01L 29/42368* (2013.01); *H01L 2924/0002* (2013.01)

(58) Field of Classification Search
CPC ....... H01L 2924/13055; H01L 29/4236; H01L 29/7813
USPC .......................................... 257/328, 773, 774
See application file for complete search history.

(56) References Cited

U.S. PATENT DOCUMENTS

| 5,321,289 A | * | 6/1994 | Baba et al. | 257/331 |
| 5,578,522 A | * | 11/1996 | Nakamura et al. | 438/138 |
| 5,945,708 A | | 8/1999 | Tihanyi | |

(Continued)

FOREIGN PATENT DOCUMENTS

| CN | 101364613 A | 2/2009 |
| CN | 102099919 A | 6/2011 |

(Continued)

OTHER PUBLICATIONS

Meiser, A. et al. "Vertical Transistor Component", Co-pending U.S. Appl. No. 12/836,422, filed Jul. 14, 2010.

(Continued)

*Primary Examiner* — David Chen
(74) *Attorney, Agent, or Firm* — Murphy, Bilak & Homiller, PLLC

(57) ABSTRACT

A semiconductor device includes a semiconductor body having a first surface and a second surface, at least one electrode arranged in at least one trench extending from the first surface into the semiconductor body, and a semiconductor via extending in a vertical direction of the semiconductor body within the semiconductor body to the second surface. The semiconductor via is electrically insulated from the semiconductor body by a via insulation layer. The at least one electrode extends in a first lateral direction of the semiconductor body through the via insulation layer and is electrically connected to the semiconductor via.

12 Claims, 14 Drawing Sheets

(56) References Cited

U.S. PATENT DOCUMENTS

| | | | |
|---|---|---|---|
| 2003/0178673 A1* | 9/2003 | Bhalla et al. | 257/330 |
| 2005/0167742 A1* | 8/2005 | Challa | H01L 21/3065 257/328 |
| 2006/0076660 A1* | 4/2006 | Boschlin et al. | 257/678 |
| 2006/0273386 A1 | 12/2006 | Yilmaz et al. | |
| 2008/0157217 A1* | 7/2008 | Burke | H01L 21/76801 257/379 |
| 2009/0218618 A1 | 9/2009 | Blank et al. | |
| 2009/0224313 A1* | 9/2009 | Burke | 257/330 |
| 2009/0242976 A1* | 10/2009 | Hino | H01L 29/41766 257/330 |
| 2010/0120216 A1* | 5/2010 | Chittipeddi | H01L 29/7833 438/303 |
| 2010/0314707 A1* | 12/2010 | Yedinak | H01L 29/36 257/475 |
| 2011/0127603 A1 | 6/2011 | Burke et al. | |
| 2013/0099308 A1 | 4/2013 | Gruber et al. | |

FOREIGN PATENT DOCUMENTS

| | | |
|---|---|---|
| DE | 196 38 438 A1 | 9/1996 |
| DE | 10 2006 046 869 A1 | 4/2008 |
| DE | 112009001714 T5 | 6/2011 |
| DE | 102012216969 A1 | 3/2013 |

OTHER PUBLICATIONS

Hirler, F. et al. "Semiconductor Component with a Semiconductor Via", Co-pending U.S. Appl. No. 12/964,865, filed Dec. 10, 2010.

\* cited by examiner

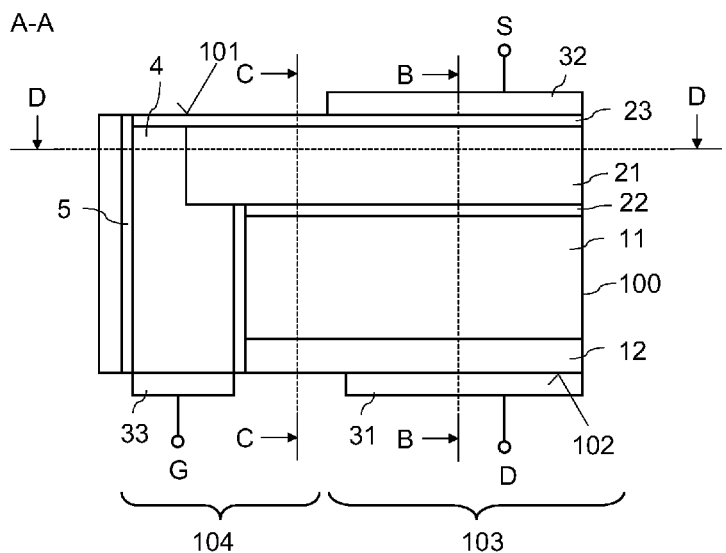
FIG 1A
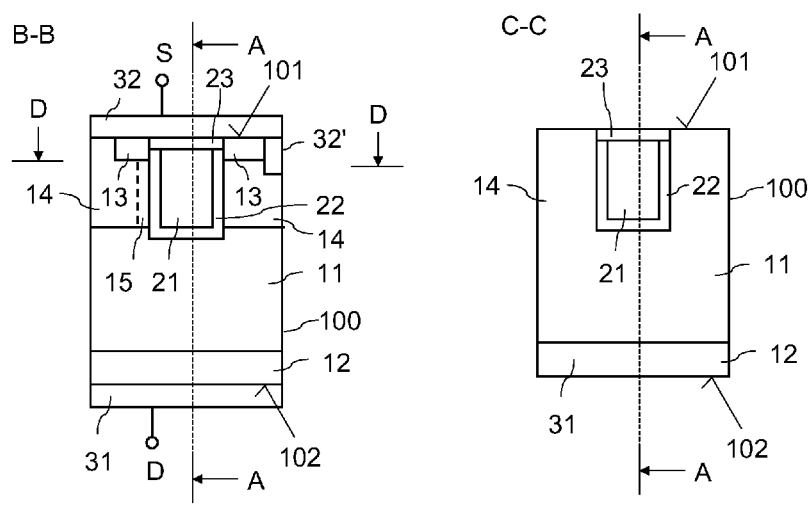
FIG 1B
FIG 2

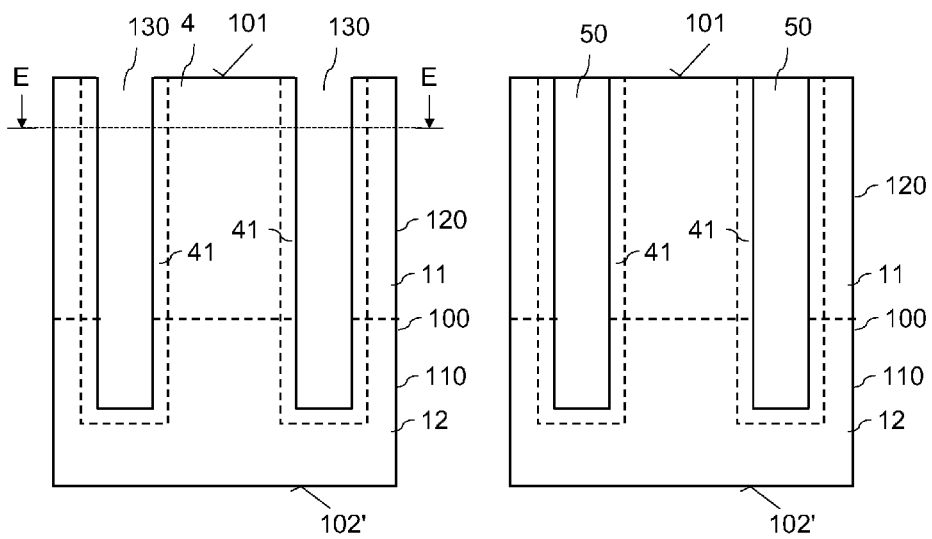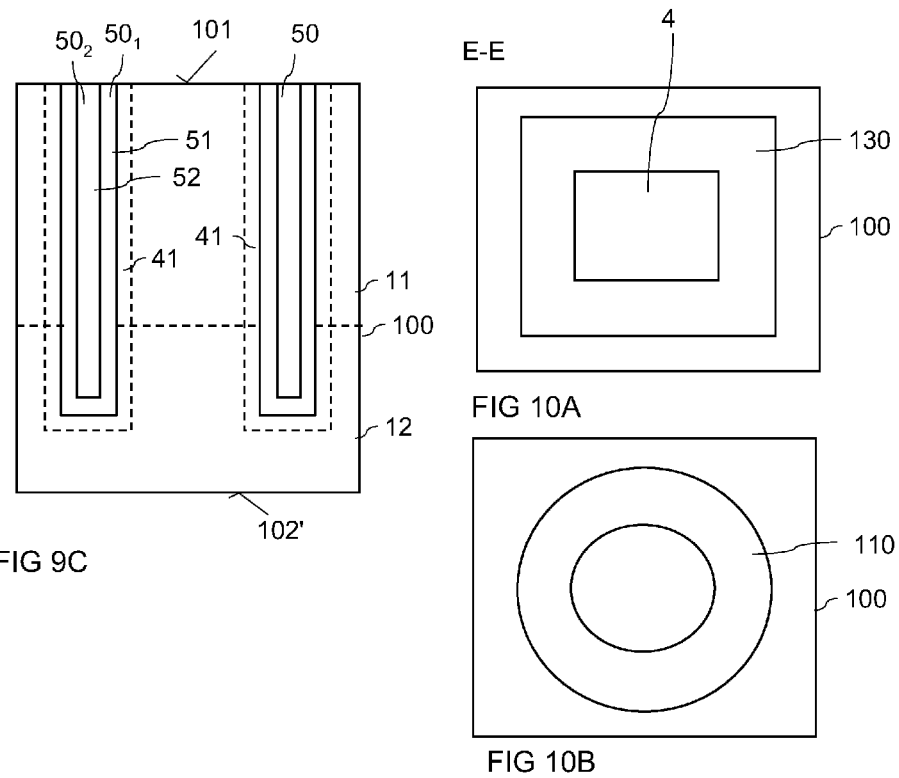

B-B

SEMICONDUCTOR DEVICE WITH A SEMICONDUCTOR VIA AND LATERALLY CONNECTED ELECTRODE

TECHNICAL FIELD

Embodiments of the present invention relate to a semiconductor device, in particular to a trench transistor device, and to a method for producing a trench transistor device.

BACKGROUND

A trench transistor device, such as a trench MOSFET (metal oxide semiconductor field effect transistor) or a trench IGBT (insulated gate bipolar transistor), is a vertical transistor device that includes a semiconductor body with a first and a second surface in which at least one source region, at least one body region, a drift region, and a drain region are integrated. In an IGBT the source and drain regions are also referred to as emitter regions, and the body and drift regions are also referred to as base regions.

Usually, the source region and the body region are integrated in the region of the first surface, while the drain region is integrated in the region of the second surface and separated from the body region by the drift region. At least one gate electrode, which serves to switch the component on and off, is arranged in a trench of the semiconductor body in the region of the first surface. The source region is electrically contacted by a source electrode which is usually arranged above the first surface and which is electrically insulated from a gate terminal (gate pad), with the latter contacting the gate electrode. The drain region is electrically contacted by a drain electrode which is usually arranged above the second surface.

Vertical transistor components of this kind can be mounted on a carrier with their second surface facing towards the carrier. In such an arrangement the carrier can serve as a drain terminal of the transistor component and can further serve as a cooling element for dissipating heat generated in the semiconductor body. When the vertical transistor element is operated as a switch, heat is mainly generated in its active regions, like body and drift regions. Since these active regions are arranged close to the first surface while the cooling element is arranged on the second surface, there is a relatively high thermal resistance resulting from those regions of the semiconductor body which are arranged between the pn-junction and the second surface. The thermal resistance could be reduced by arranging a cooling element on the first surface. However, such cooling element would short-circuit the gate and the source electrode which are both arranged at the first surface.

There is, therefore, a need for a semiconductor device which has better properties in terms of dissipating heat from the semiconductor component.

SUMMARY

A first embodiment relates to a semiconductor device. The semiconductor device includes a semiconductor body having a first surface and a second surface, at least one electrode arranged in at least one trench extending from the first surface into the semiconductor body, and at least one semiconductor via. The at least one semiconductor via extends in a vertical direction of the semiconductor body within the semiconductor body to the second surface and is electrically insulated from the semiconductor body by a via insulation layer. The at least one electrode extends in a first lateral direction of the semiconductor body through the via insulation layer and is electrically connected to the at least one semiconductor via.

A second embodiment relates to a method for producing a semiconductor device. The method includes providing a semiconductor body having a first surface, a second surface and a semiconductor via, the semiconductor via extending in a vertical direction of the semiconductor body within the semiconductor body to the second surface and being insulated from the semiconductor body by a via insulation layer. The method further includes etching at least one first trench that extends from the first surface into the semiconductor body, wherein the trench in a first lateral direction of the semiconductor body extends through the via insulation layer into the semiconductor via, and forming at least one electrode in the at least one trench such that the at least one electrode is dielectrically insulated from semiconductor regions of the semiconductor body and is electrically connected to the semiconductor via. Further, a contact electrode is formed on the semiconductor via on the second surface.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 1 which includes FIGS. 1A and 1B illustrates a first embodiment of a trench transistor device including a semiconductor via.

FIG. 2 illustrates a vertical cross sectional view of the transistor device of FIGS. 1A and 1B according to one embodiment.

FIG. 7 which includes

FIG. 8 which includes

FIG. 9 which includes FIGS. 9A to 9C illustrates an embodiment of a method for producing a semiconductor via and a via insulation layer surrounding the semiconductor via.

FIG. 10 which includes FIGS. 10A to 10B illustrates horizontal cross sectional views of the semiconductor via according to a first and a second embodiment.

FIG. 12 which includes

FIG. 13 which includes

FIG. 14 which includes

DETAILED DESCRIPTION

Figure 3:
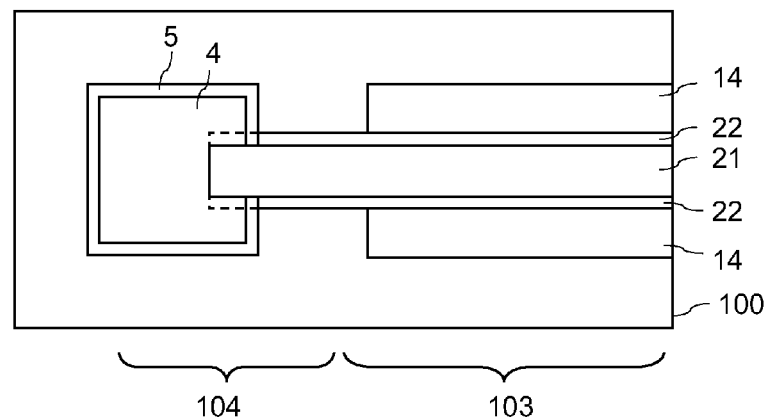
FIG. 3 illustrates a horizontal cross sectional view of the transistor device of FIGS. 1A and 1B according to a first embodiment.

FIGS. 1A and 1B schematically illustrate a first embodiment of a vertical transistor device, specifically of a trench transistor device. The transistor device includes a semiconductor body 100 with a first surface 101 and a second surface 102. FIGS. 1A and 1B each show vertical cross sectional views of the semiconductor body 100, where FIG. 1A shows the semiconductor body 100 in a first vertical section plane A-A and FIG. 1B shows a vertical cross sectional view in a second vertical section plane B-B. These vertical section planes A-A, B-B extend perpendicular to the first and second surfaces 101, 102 of the semiconductor body 100. FIGS. 1A and 1B each only show a section of the semiconductor body 100.

Referring to FIG. 1A, the transistor device includes a semiconductor via 4 that extends within the semiconductor body 100 in a vertical direction of the semiconductor body 100 to the second surface 102. A "vertical direction" of the semiconductor body 100 is a direction perpendicular to the first and second surfaces 101, 102. The semiconductor via 4 is electrically insulated from the surrounding semiconductor body 100 by a via insulation layer 5. The via insulation layer 5 includes, for example, a conventional electrically or dielectrically insulating material, such as an oxide, a nitride, or the like. The via insulation layer 5 could also be implemented as a composite layer including a plurality of different electrically insulating layers.

The semiconductor via 4 is electrically connected to a gate connection electrode 33 in the region of the second surface 102 of the semiconductor body 100. The gate connection electrode 33 forms a gate terminal G or is electrically connected to a gate terminal G of the transistor device. The semiconductor via 4 electrically connects the gate terminal G to a gate electrode 21 of the transistor device.

The gate electrode 21 is at least partially arranged in a trench that extends in a vertical direction of the semiconductor body 100 from the first surface 101. This trench and, therefore, the gate electrode 21 has a longitudinal direction, where FIG. 1A shows a vertical cross sectional view along the longitudinal direction, and FIG. 1B shows a vertical cross sectional view in a section plane perpendicular to the longitudinal direction. Referring to FIG. 1A the trench with the gate electrode 21 extends in a first lateral direction of the semiconductor body 100 through the via insulation layer 5 into the semiconductor via 4. The gate electrode 21 adjoins the semiconductor via 4 so as to be electrically connected to the semiconductor via 4. The gate electrode 21 may include a conventional gate electrode material, such as a metal or a polycrystalline semiconductor material, such as polysilicon.

The gate electrode 21 is dielectrically insulated from the semiconductor body 100 by a gate dielectric 22. The gate dielectric 22 may include a conventional gate dielectric material, such as a thermally grown or a deposited oxide.

In the embodiment illustrated in FIG. 1A, the gate electrode 21 adjoins the semiconductor via 4 at a bottom and a sidewall of the trench in which it is implemented. However, this is only an example. According to a further embodiment (not illustrated), the gate electrode 21 adjoins the semiconductor via 4 only at the sidewall of the trench or at the bottom of the trench.

Referring to FIG. 1B the transistor device further includes a drift region 11, a drain region 12, a source region 13 and a body region 14. The source region 13 is arranged in the region of the first surface 101 and is electrically connected to a source electrode 32 arranged on the first surface 101. The drain region 12 is arranged in the region of the second surface 102 and is electrically connected to a drain electrode 31 arranged on the second surface 102. The body region 14 adjoins the source region 13 and the drift region 11 and is arranged between the source region 13 and the drift region 11. The drift region 11 may adjoin the drain region 12 (as illustrated). According to a further embodiment, a field stop region of the same doping type as the drift region 11 is arranged between the drift region 11 and the drain region 12. Doping concentrations of the individual semiconductor regions are, for example, as follows: drift region 11: $10^{14}$ cm$^{-3}$ to $10^{17}$ cm$^{-3}$; source region 13 and drain region 12: $10^{19}$ cm$^{-3}$ to $10^{21}$ cm$^{-3}$; body region 14: $10^{16}$ cm$^{-3}$ to $10^{18}$ cm$^{-3}$.

Referring to FIG. 1B, the gate electrode 21 extends from the source region 13 through the body region 14 to or into the drift region 11 and is dielectrically insulated from these semiconductor regions by the gate dielectric 22. An insulation layer 23 arranged above the gate electrode 21 separates the gate electrode 21 from the source electrode 32. The source electrode 32 is also electrically connected to the body region 14. For this, the body region 14 may include a body region section that extends to the first surface 101. This is illustrated in the left section of FIG. 1B. According to further embodiments, the source electrode 32 includes an electrode section 32' that extends through the source region 13 into the body region 14. This is illustrated in the right section of FIG. 1B.

Referring to FIG. 1A the semiconductor body 100 includes a transistor cell region 103 and a gate connection region 104. In the transistor cell region 103 at least one transistor cell is arranged. One transistor cell includes a longitudinal gate electrode 21 and source and body regions 13, 14 arranged on both sides of the longitudinal gate electrode 21. FIG. 1B shows a vertical cross section through one transistor cell (in this connection that an arrangement as illustrated in FIG. 1B could also be considered to include two transistor cells).

The gate connection region 104 includes the semiconductor via 4, the via insulation layer 5 and a section of the gate electrode 21 extending from the transistor cell region 103 to or into the semiconductor via 4. While in the embodiment illustrated in FIG. 1A, the gate electrode 21 extends into the semiconductor via 4, it would also be sufficient for the gate electrode 21 to only extend through the via insulation layer 5 to the semiconductor via 4.

Referring to FIG. 2, which illustrates a vertical cross sectional view of the semiconductor body 100 in a vertical section plane C-C that is arranged in the connection region 104 and that extends perpendicular to the longitudinal direction of the gate electrode 21, source and body regions can be omitted in the connection region 104 between the semiconductor via 4 and the transistor cell region 103.

A plurality of different implementations of the transistor cell region 103 and the semiconductor via 4 are possible. For explanation purposes, four different implementations are explained with reference to FIGS. 3 to 6. Each of these Figures illustrates a horizontal cross sectional view of the semiconductor body 100 in a horizontal section plane D-D illustrated in FIGS. 1A and 1B.

Referring to FIG. 3 only one transistor cell with a gate electrode 21 arranged in one trench is arranged in the transistor cell region 103.

Figure 4:
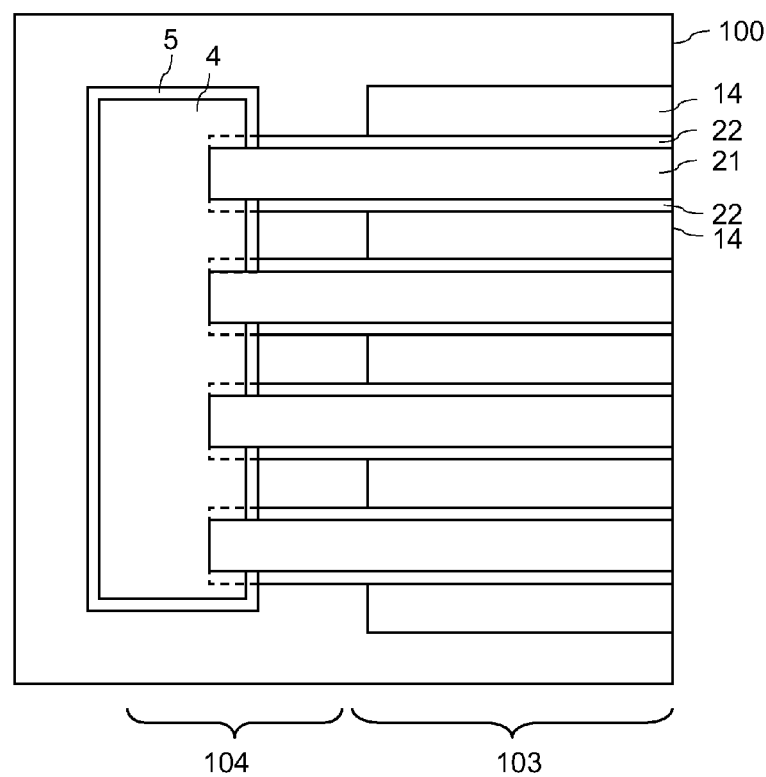
FIG. 4 illustrates a horizontal cross sectional view of the transistor device of FIGS. 1A and 1B according to a second embodiment.

Referring to FIG. 4 a plurality of transistor cells are arranged in the transistor cell region 103, where each of these transistor cells includes one section of the gate electrode 21 arranged in a longitudinal trench. Each of these sections of the gate electrode 21 extends in the first lateral direction through the via insulation layer 5 into the semiconductor via 4, is electrically connected to the semiconductor via 4, and is electrically connected to the gate terminal G through the semiconductor via 4. Since the semiconductor via 4 electrically connects each of the sections of the gate electrode 21 to the gate terminal G no connections are required that electrically connect the individual sections of the gate electrode 21 with each other.

Implementing the individual transistor cells with longitudinal gate electrodes or longitudinal gate electrode sections is only an example. According to a further embodiment, illustrated in FIG. 5, the gate electrode 21 is grid-shaped and has sections that extend through the via insulation layer 5 into the semiconductor via 4. In the embodiment illustrated in FIG. 5, the grid of the gate electrode 21 is a rectangular grid. However, this is only an example. The gate electrode 21 could also be implemented with any other type of grid, such as a hexagonal grid.

Figure 5:
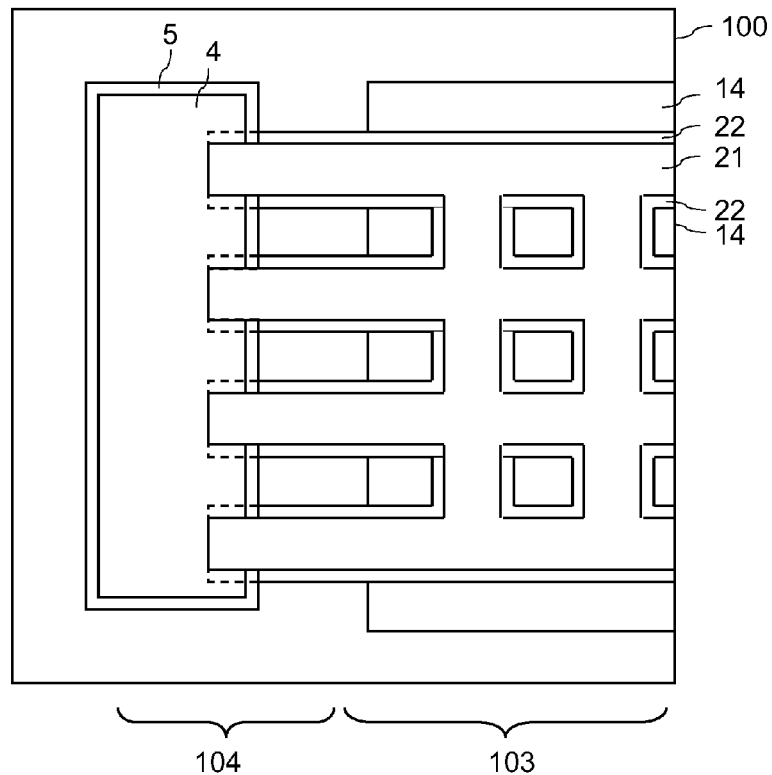
FIG. 5 illustrates a horizontal cross sectional view of the transistor device of FIGS. 1A and 1B according to a third embodiment.

In the transistor devices according to FIGS. 3 to 5 only one lateral end of the gate electrode 21 or the sections of the gate electrode 21 are illustrated. On opposite lateral ends a further semiconductor via 5 may be arranged that is connected to the lateral ends of the gate electrode 21 or the sections of the gate electrode 21, so that the transistor device in this case includes two semiconductor vias 4. These two semiconductor vias 4 are electrically connected to a common gate terminal G. However, it is also possible to provide a semiconductor via only at one lateral end of the gate electrode 21.

Figure 6:
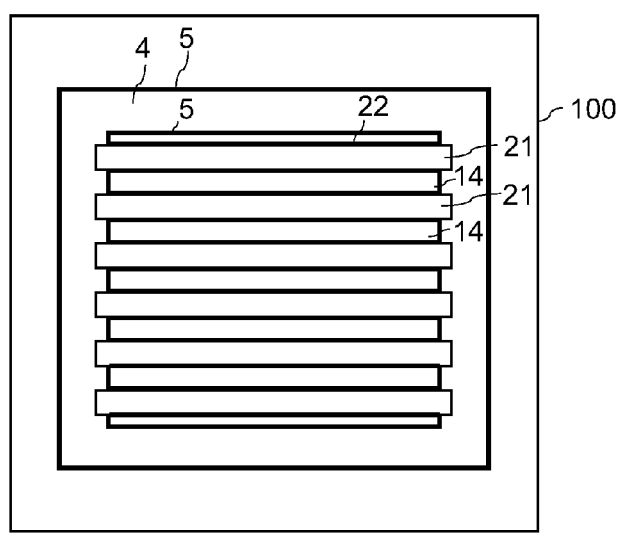
FIG. 6 illustrates a horizontal cross sectional view of the transistor device of FIGS. 1A and 1B according to a fourth embodiment.

Referring to a further embodiment illustrated in FIG. 6, the semiconductor via 4 surrounds the transistor cell region 103 and is electrically connected to the sections of the gate electrode 21 at both lateral ends of these longitudinal sections of the gate electrode 21. FIG. 6 schematically illustrates a horizontal cross sectional view of the transistor device in a smaller scale compared with the horizontal cross sectional views illustrated in FIGS. 3 to 5. The gate dielectric 22 and the via insulation layer 5 are illustrated as bold lines in FIG. 6.

Figure 7A:
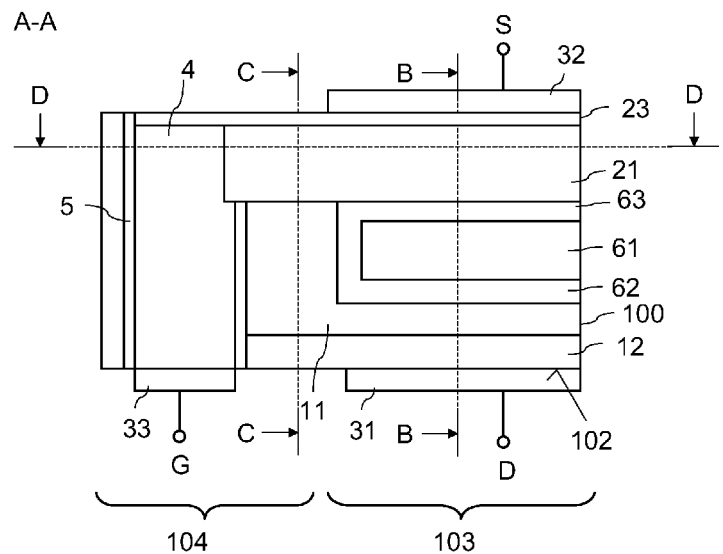
FIGS. 7A to 7C illustrates a further embodiment of a transistor device with a semiconductor via.
Figure 7B:
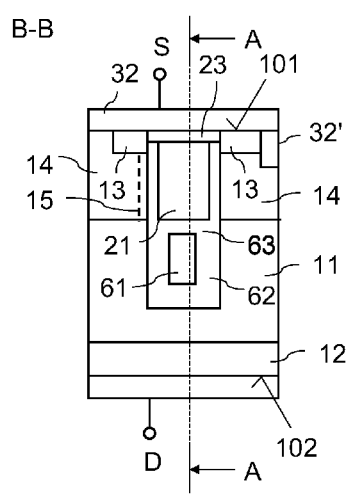
Figure 7C:
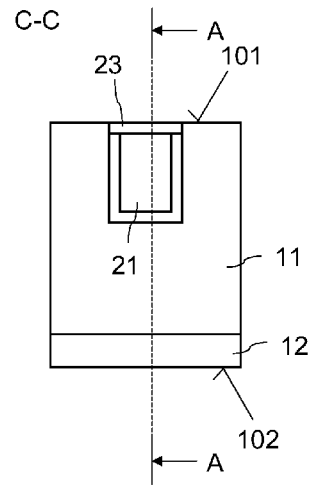

FIGS. 7A to 7C illustrate vertical cross sectional views of a trench transistor device according to a further embodiment. FIG. 7A shows the transistor device in a first vertical section plane A-A, FIG. 7B shows the transistor device in a second vertical section plane B-B, and FIG. 7C shows the transistor device in a third vertical section plane C-C. These section planes A-A, B-B, C-C correspond to the section planes explained with reference to FIGS. 1A, 1B and 2.

Referring to FIGS. 7A and 1B, the transistor device includes a field electrode 61 arranged in the same at least one trench as the gate electrode 21 and below the gate electrode 21. Basically, the geometry of the field electrode 61 corresponds to the geometry of the gate electrode 21, so that dependent on the form of the gate electrode 21 the field electrode 61 may include a plurality of longitudinal field electrode sections or may have a grid-shaped geometry.

The field electrode 61 is dielectrically insulated from the semiconductor body 100 by a field electrode dielectric 62 and is dielectrically insulated from the gate electrode 21 by a further dielectric layer 63. This further dielectric layer 63 will be referred to as inter-electrode dielectric 63 in the following. According to one embodiment, the field electrode 61 is electrically connected to the source electrode 32. For this, the field electrode 61 may include sections that in a vertical direction of the semiconductor body 100 extend to the source electrode 32 and are dielectrically insulated from the gate electrode 21. However, these sections are not explicitly illustrated in FIGS. 7A to 7C. According to a further embodiment, the inter-electrode dielectric 63 is omitted. In this case, the field electrode 61 is electrically connected to the gate electrode 21. Referring to FIG. 7B the field electrode dielectric 62 is thicker than the gate dielectric 22.

In the embodiment illustrated in FIG. 7A, the field electrode 61 is only arranged in the transistor cell region 103 and, therefore, does not extend to the semiconductor via 4 in the first lateral direction. This is also illustrated in FIG. 7C, which illustrates a vertical cross sectional view of the transistor device in the gate connection region 104.

The operating principle of the transistor device corresponds to the operating principle of a conventional transistor device, in particular a conventional MOSFET or a conventional IGBT. Since the drain electrode 31 and the gate connection electrode 33 are arranged on the same surface of the semiconductor body 100, namely the second surface 102, while only the source electrode 32 is arranged on the first surface 101, the source electrode 32 can be mounted to a cooling element (not shown) which allows to efficiently cool the semiconductor device during operation. In operation of the semiconductor device most of the energy that is dissipated in the transistor device is dissipated at a pn-junction between the body region 14 and the drift region 11 which is close to the first surface 101. By mounting the source electrode 32 to a cooling element (not shown), the heat generated at the pn-junction can be efficiently removed from the semiconductor body 100.

The transistor device can be implemented as any conventional type of MOSFET or IGBT, where the type of transistor device is dependent on the doping types of the individual semiconductor regions. In an n-type MOSFET the source region 13, the drift region 11 and the drain region 12 are n-doped and the body region 11 is p-doped, while in a p-type MOSFET the source region 13, the drift region 11 and the drain region 12 are p-doped, while the body region 14 is n-doped. In an IGBT the doping type of the drain region 12 is complementary to the drift region 11. The transistor can be implemented as an enhancement MOSFET. In this case, the body region 14 which is doped complementarily to the source region 13 and the drift region 11 adjoins the gate dielectric 22. The transistor could also be implemented as a depletion transistor. In this case, a channel region of the same doping type as the source region 13 and the drift region 11 extends along the gate dielectric 22 between the source region 13 and the drift region 11. This channel region 15 is illustrated in dashed lines in FIGS. 1B and 7B.

FIGS. 1A and 1B and FIGS. 7A and 7C schematically illustrate different embodiments of a transistor device. These Figures basically illustrate different embodiments of the transistor device, where specific geometries or dimensions of electrodes, dielectric layers and semiconductor regions illustrated in these Figures may, of course, vary. In particular, the specific geometry of the gate electrode 21 and the field electrode 61 may vary dependent on the specific method employed for producing the transistor device.

Figure 8A:
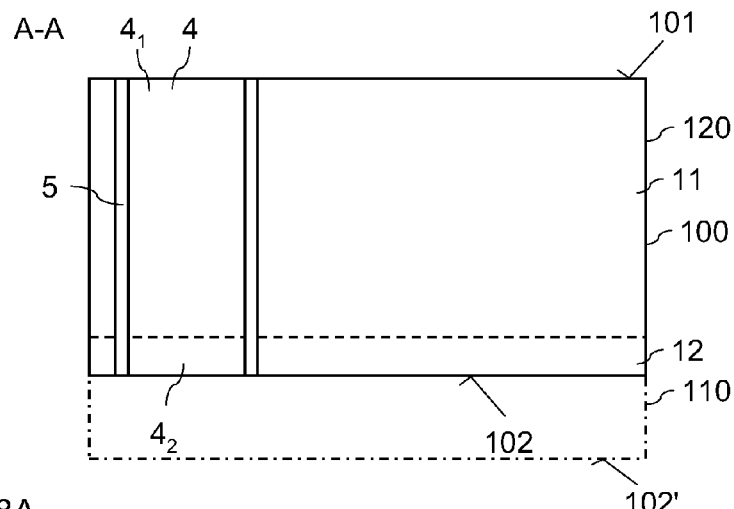
FIGS. 8A to 8C illustrates a method for producing a vertical transistor device according to a first embodiment.
Figure 8B:
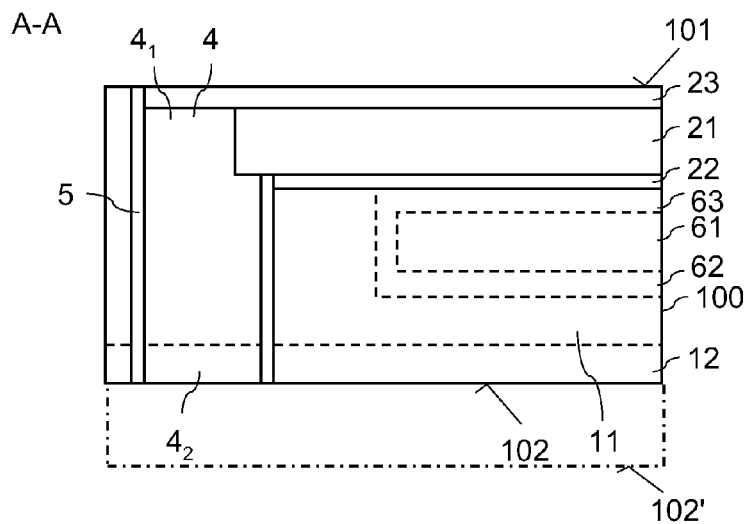
Figure 8C:
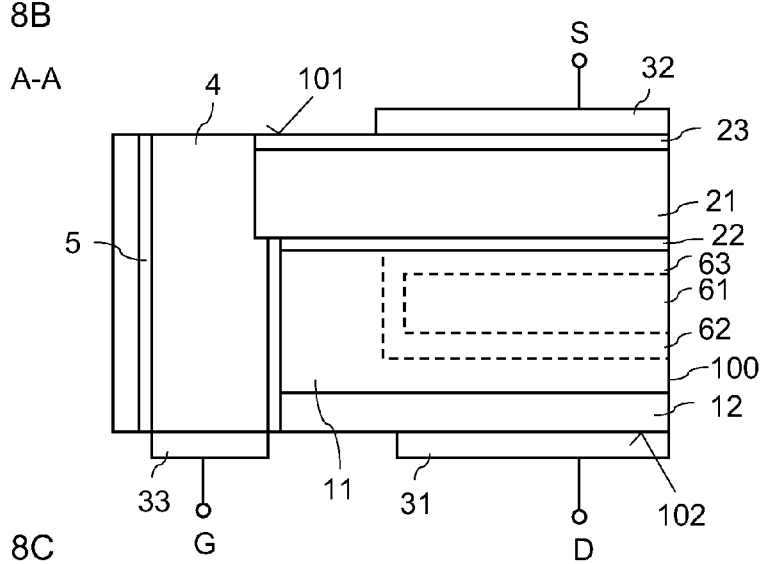

FIGS. 8A to 8C illustrate an embodiment of a method for producing a transistor device as explained herein before. This method for producing the vertical trench transistor device with the drain electrode 31 and the gate connection electrode 33 on the second surface 102 and the source electrode 32 of the first surface 101 includes three main process sequences (method step sequences). The results of these three main process sequences are illustrated in FIGS. 8A to 8C which each illustrate a horizontal cross sectional view of the semiconductor body 100 in a vertical section plane that corresponds to section plane A-A illustrated in FIGS. 1A and 7A.

Referring to FIG. 8A, a first process sequence includes forming the semiconductor via 4 surrounded by the via insulation layer 5 in the semiconductor body 100. Embodiments of methods for producing the semiconductor via 4 in the semiconductor body 100 are explained with reference to FIGS. 9A to 9C, 10A, 10B, 11 and 12 below. Referring to FIG. 8A, the semiconductor via 4 can be produced to extend completely through the semiconductor body 100, which means from the first surface 101 to the second surface 102 and surrounded by the via insulation layer 5 within the semiconductor body 100. Referring to what is illustrated in dashed and dotted lines in FIG. 8A, the semiconductor via 4 can be produced such that it first only extends from the first surface 101 into the semiconductor body 100 but does not completely extend through the semiconductor body 100. At this stage of the manufacturing process a second surface 102' of the semiconductor body 100 is not yet the final second surface 102 of the transistor device. Later in the manufacturing process parts of the semiconductor body 100 are removed at the second surface 102', so as to uncover the semiconductor via 4 at the second surface 102. This removal process may include an etching process and/or a polishing process, such as a chemical polishing process, a mechanical polishing process or a chemical-mechanical polishing process (CMP).

The semiconductor via 4 is, for example, produced by forming the via insulation layer 5 that extends into the semiconductor body 100 from the first surface 101. The via insulation layer 5 separates the semiconductor body 100 into the semiconductor via 4 and remaining regions of the semiconductor body 100, where in the remaining regions of the semiconductor body 100 the at least one transistor cell of the transistor device is implemented.

Referring to FIG. 8A the semiconductor body 100 may include two differently doped semiconductor layers, namely a first semiconductor layer 110 and a second semiconductor layer 120. The first semiconductor layer 110 is, for example, a semiconductor substrate, while the second semiconductor layer 120 is, for example, an epitaxial layer. According to one embodiment, the first semiconductor layer 110 forms the drain region 12 of the transistor device, while the drift region 11, the source and body regions 13, 14 and the gate electrode 21 with the gate dielectric 22 are implemented in the second semiconductor layer 120. The second semiconductor layer 120 has a basic doping concentration that is lower than the basic doping concentration of the first semiconductor layer 110, where those regions of the second semiconductor layer 120 that keep the basic doping concentration in subsequent process steps form the drift region 11 of the transistor device. When the semiconductor body 100 includes two differently doped semiconductor layers 110, 120, the semiconductor via 4 includes two differently doped via sections, namely a first via section $4_1$ adjacent the first surface 101 and having a doping concentration corresponding to the doping concentration of the second layer 120, and a second via section $4_2$ which is finally adjacent the second surface 102 and connected to the gate connection electrode 33. The second via section $4_2$ has a doping concentration that corresponds to the doping concentration of the first layer 110.

Referring to FIG. 8B a second process sequence includes forming the gate electrode 21 and the gate dielectric 22 as well as the optional field electrode 61 with the field electrode dielectric 62 and the inter-electrode dielectric 63. This process sequence further includes forming the insulation layer 23 on top of the gate electrode 21 which insulates the gate electrode 21 from the source electrode 32.

Referring to FIG. 8C, a third process sequence includes forming the source and body regions (out of view in FIG. 8C), forming the source electrode 32 on the first surface 101, and the drain electrode 31 and the gate connection electrode 33 on the second surface 102. When the semiconductor via 4 has been produced to not completely extend through the semiconductor body 100 (as illustrated in dashed and dotted lines in FIG. 8A), a removal process is performed before producing the drain electrode 31 and the gate connection electrode 33. In this removal process parts of the semiconductor body 100 are removed in order to uncover the semiconductor via 4 at the second surface 102. Forming the electrodes, such as the source electrode 32, the gate electrode 33 and the drain electrode 31 may, in particular, include the deposition of an intermediate dielectric layer on the first and/or second surface 101, 102 of the semiconductor body 100, forming contact holes in the intermediate dielectric layer that extend through the intermediate dielectric layer to those regions that are to be contacted by the respective electrode, such as the source regions 13, the drain region 12 and the semiconductor via 4, and depositing an electrode material on the intermediate dielectric that fills the contact hole, so as to form the electrode. The electrode material is, e.g., a metal, such as copper, aluminum, tungsten, etc. In the drawings, however, the electrodes 31, 32, 33 are only schematically shown so that these intermediate dielectrics are not illustrated.

One embodiment of a method for producing the semiconductor via 4 is explained with reference to FIGS. 9A to 9C below.

Referring to FIG. 9A a ring-shaped trench 130 is formed to extend from the first surface 101 into the semiconductor body 100. This trench 130 does not completely extend through the semiconductor body 100, so that a second surface 102' of the semiconductor body 100 at this stage of the manufacturing process does not yet correspond to the final second surface 102 of the semiconductor body of the transistor device. Referring to FIGS. 10A and 10B, which each show a horizontal cross sectional view of the semiconductor body 100 of FIG. 9A, one ring-shaped trench 130 is formed that may have a conventional geometry, such as a rectangular geometry (see FIG. 10A) and elliptical or circular geometry (see FIG. 10B), a hexagonal geometry or any other polygonal geometry (not shown). In these cases the semiconductor via 4 basically has a pile-shaped geometry.

Figure 11:
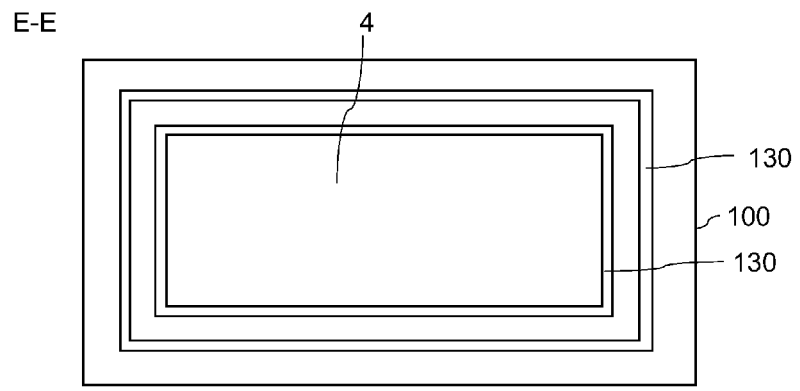
FIG. 11 illustrates a horizontal cross sectional view of the semiconductor via according to a further embodiment.

Referring to further embodiments illustrated in FIG. 11, two ring-shaped trenches 130 are formed, where the semiconductor via 4 is the semiconductor region between these two trenches and also has a ring-shaped geometry.

Again referring to FIG. 9A, dopant atoms can be implanted and/or diffused via the at least one ring-shaped trench 130 into the semiconductor body 100, in particular into sidewalls of the at least one trench 130 that adjoins the semiconductor via 4. These dopant atoms are of the same conductivity type as the dopant atoms that form the semiconductor via 4 prior to the diffusion and/or implantation process. In FIG. 9A reference character 41 denotes doped regions along the sidewalls of the at least one trench 130 formed by the optional diffusion and/or implantation process. These higher doped regions 41 along the sidewalls of the at least one trench 130 help to reduce an electrical resistance of the semiconductor via 4.

Referring to FIG. 9B, the at least one trench 130 is filled with an electrically insulating material 50, such as an oxide or a nitride. An oxide can be formed by employing a thermal oxidation process and/or by a deposition process.

Referring to FIG. 9C, the electrical insulating layer 50 filling the at least one trench 130 may include several sub-layers, such as a first sub-layer $50_1$ on the sidewalls and the bottom of the trench 130 and a second sub-layer $50_2$ arranged on the first sub-layer $50_1$ and completely filling the trench 130. The first sub-layer $50_1$ may be a thermally grown oxide, while the second sub-layer $50_2$ may be a deposited oxide or a nitride. At least sections of the electrically insulating layer 50 in the at least one trench 130 form the via insulation layer 5 of the final transistor device.

A first embodiment of a method for producing the gate electrode 21 is explained with reference to FIGS. 12A to 12I below. FIGS. 12A to 12C and 12E to 12I illustrate vertical cross sectional views of the semiconductor body 100, while FIG. 12D illustrates a horizontal cross sectional view. In the vertical cross sectional view only those sections of the semiconductor body 100 below the first surface 101 are shown in which the gate electrode 21 is produced. The second surface 102 of the semiconductor body 100 is not illustrated in these Figures.

Figure 12A:
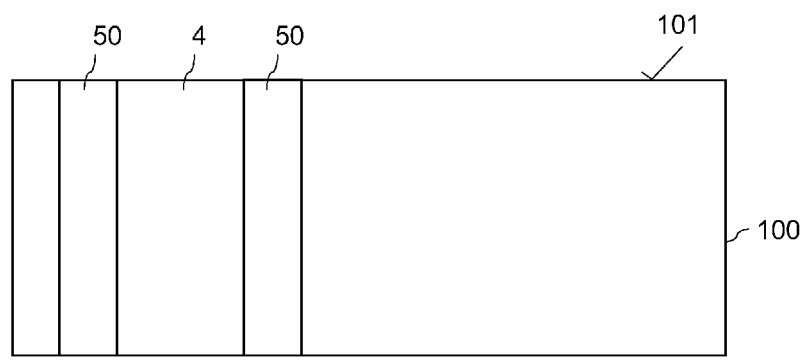
FIGS. 12A to 12I illustrates a second embodiment of a method for producing a vertical transistor device.

FIG. 12A illustrates a vertical cross sectional view of the semiconductor body 100 after producing the semiconductor via 4 and the insulation layer 50 surrounding the semiconductor via 4. Referring to FIG. 12C at least one longitudinal trench 140 is formed in the transistor cell region 103 and the connection region 104 of the semiconductor body 100. The at least one trench 140 in the first lateral direction extends through the insulation layer 50 into the semiconductor via 4. The geometry of this trench 140 defines the geometry of the gate electrode 21. Referring to the explanation provided with reference to FIGS. 3 to 4, one trench 140, a plurality of parallel trenches 140 or a trench 140 with a grid-shaped geometry may be formed.

Forming the at least one trench 140 may include an etching process employing an etch mask 210 which defines the size and the geometry of the at least one trench 140. The etch mask 210 which is also illustrated in FIG. 12C is, for example, an oxide hard mask.

Figure 12B:
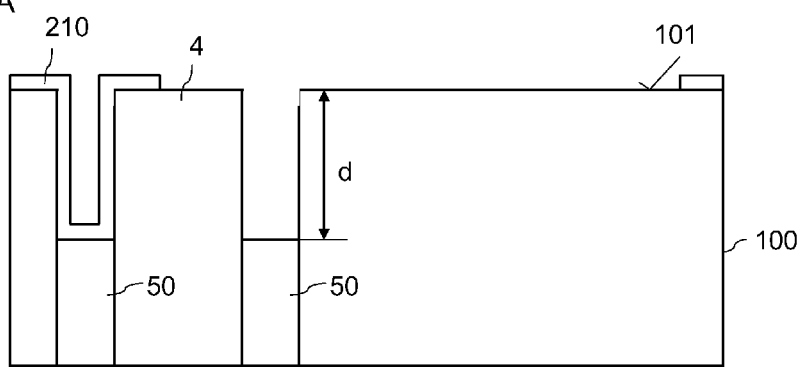
Figure 12C:
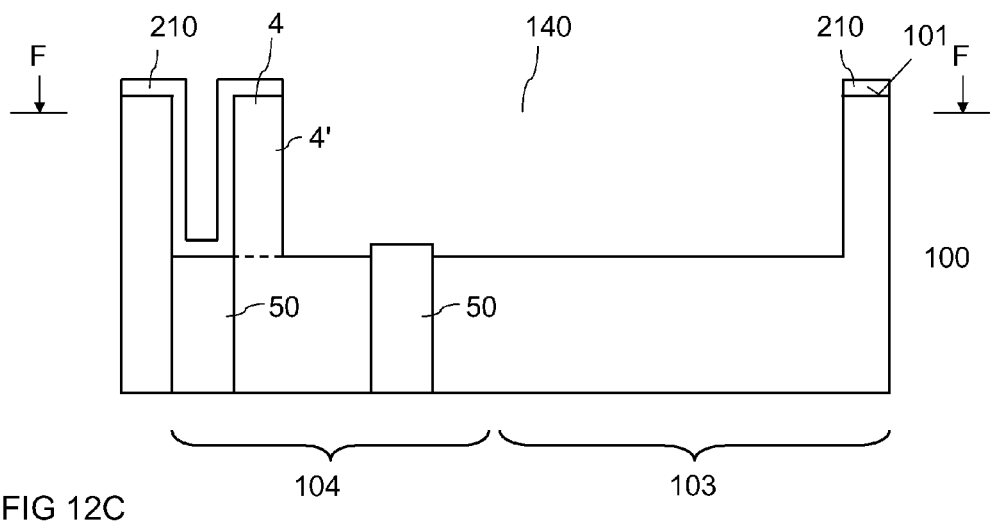
Figure 12D:
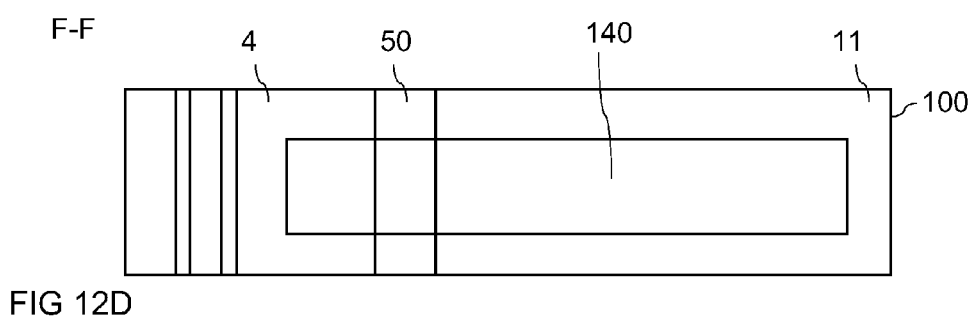

Referring to FIG. 12B, forming the at least one trench 140, prior to forming the etch mask 210, may include removing the insulation layer 50 from upper regions of the at least one ring-shaped trench (130 in FIG. 9A), which means from those regions adjoining the first surface 101. A depth d of a region in which the insulation layer 50 is removed, may correspond to a desired depth of the at least one trench 140. Removing the insulation layer 50 may include an etching process that etches the material of the insulation layer 50 selectively relative to the material of the semiconductor body 100. After removing the insulation layer 50 from upper regions of the ring-shaped trench, the etch mask 210 is produced, where the etch mask 210 covers the surface 101 of the semiconductor body 100 in those regions which should not be etched when producing the at least one trench 140. Referring to FIG. 12C the etch mask 210 at least covers the sidewalls of those regions of the ring-shaped trench which should not be etched when producing the at least one trench 140. Referring to FIG. 12C, the at least one trench 140 is formed such that it extends into the semiconductor via 4 in the first lateral direction, but does not completely extend through the semiconductor via 4, so that a section 4' of the semiconductor via 4 remains between the trench 140 and those sections of the ring-shaped trench that remain after the process of producing the at least one trench 140.

According to a further embodiment (illustrated in dashed lines in FIG. 12C), the at least one trench 140 in the lateral direction extends through the insulation layer 50 on one side of the semiconductor via 4, through the semiconductor via 4 and to or into the insulation layer 50 or the etch mask 210 on the other side of the semiconductor via. While in the embodiment illustrated in solid lines in FIG. 12C the semiconductor via 4 adjoins the trench at a bottom and at a longitudinal end (the section 4' adjoins the longitudinal end of the trench 140), in the embodiment illustrated in dashed lines the semiconductor via 4 only adjoins the bottom of the trench 140.

FIG. 12D illustrates a horizontal cross sectional view of the semiconductor body 100 in a section plane F-F illustrated in FIG. 12C. FIGS. 12A to 12I illustrate a method for producing a gate electrode 21 which is electrically connected to a semiconductor via 4 at one lateral end. However, this method can easily be adapted to a method for producing a gate electrode 21 that is electrically connected to a semiconductor via at both lateral ends.

Figure 12E:
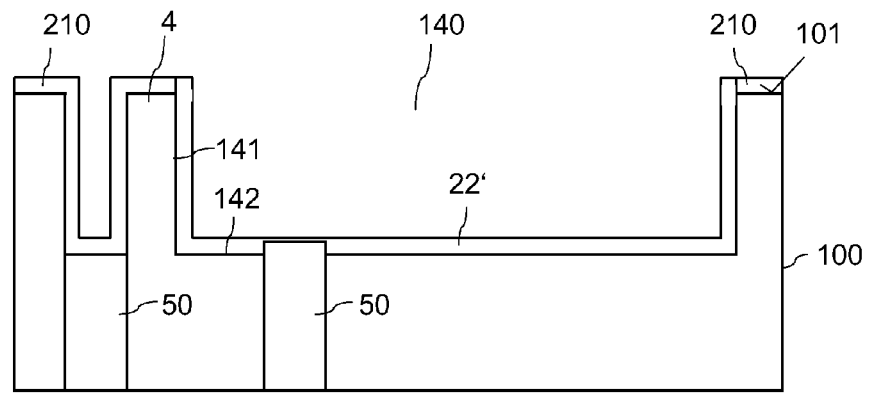

Referring to FIG. 12E a dielectric layer 22' is produced on the bottom and the sidewalls of the at least one trench 140. Sections of the dielectric layer 22' form the gate dielectric 22 of the transistor device. The dielectric layer 22' is, for example, a thermally grown oxide layer.

Figure 12F:
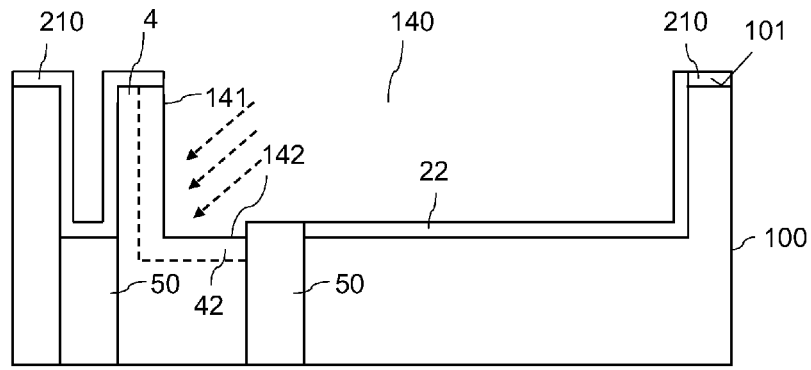

Referring to FIG. 12F, at least sections of the dielectric layer 22' covering the semiconductor via 4 are removed. Referring to FIG. 12E, the at least one trench 140 has sidewall sections 141 and a bottom section 142 that adjoin the semiconductor via 4. In the embodiment illustrated in FIGS. 12E and 12F, the dielectric layer 22' is completely removed from these sidewall sections 141 and bottom section 142. However, this is only an example. It is also possible to remove the dielectric layer 22' only from one of the sidewall sections 141 and the bottom section 142.

Referring to FIG. 12F, dopant atoms are optionally implanted and/or diffused into those regions of the semiconductor via 4 that are uncovered after the removal process that at least partially removes the dielectric layer 22'. The dopant atoms form a higher doped via region 42, where this higher doped region helps to reduce the electrical resistance between the gate electrode 21 produced in next method steps and the semiconductor via 4.

Figure 12G:
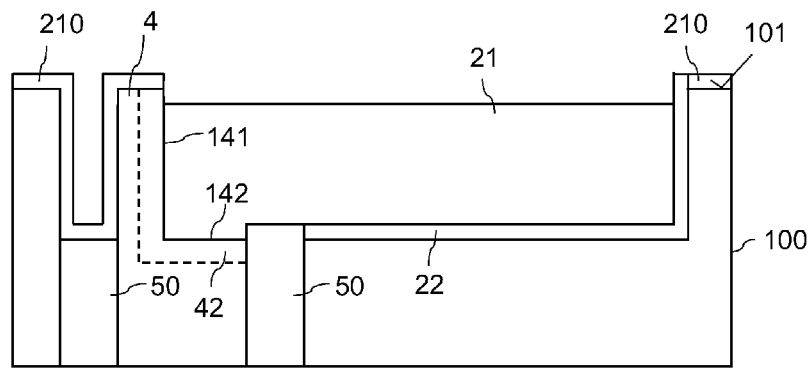
Figure 12H:
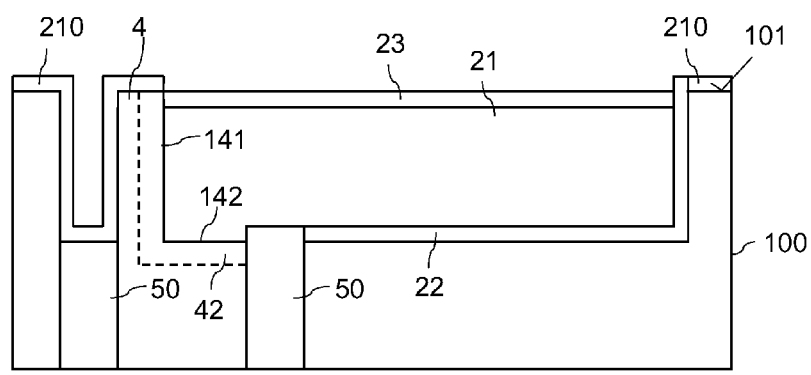

Referring to FIG. 12G, the gate electrode 21 is formed in the at least one trench 140. Forming the gate electrode 21 may include completely filling the trench 140 with a gate electrode material and etching back the gate electrode material to below the first surface 101. Referring to FIG. 12H, the insulation layer 23 is then produced on top of the gate electrode 21. Forming the insulation layer 23 may include a thermal oxidation process and/or a deposition process. The gate electrode 21 includes, for example, a metal and/or a polycrystalline semiconductor material, such as polysilicon.

Figure 12I:
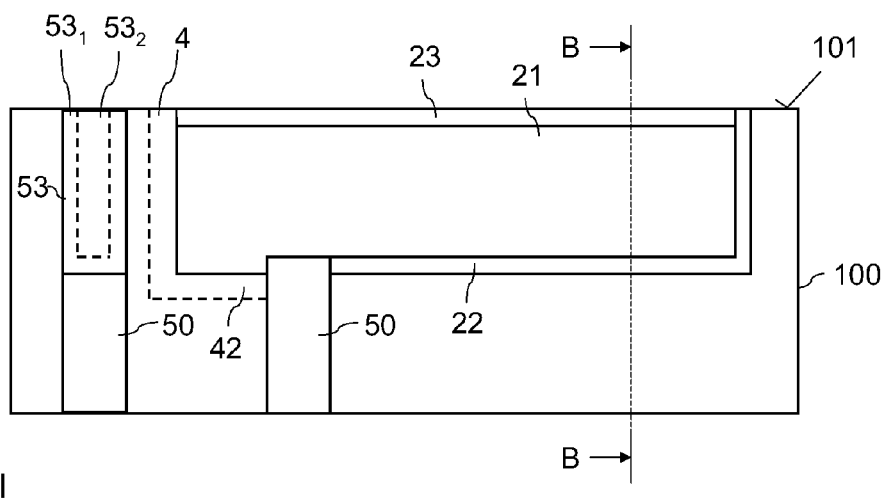

The etch mask 210 may remain on the first surface 101 of the semiconductor body 100 during the process steps after forming the at least one trench 140. Referring to FIG. 12I the etch mask 210 is then removed from the first surface 101. Removing the etch mask 210 may, for example, include a polishing process, such as a mechanical polishing process, a chemical polishing process or a chemical-mechanical polishing process. The etch mask 210 may remain in those sections of the ring-shaped trench that have not been etched in the process of producing the at least one trench 140 and may form a section 53 of the via insulation layer 5. When the etch mask 210 is produced such that it only covers the sidewalls of the ring-shaped trench, a remaining trench is completely filled with an insulating material. In FIG. 12I, reference character 53$_1$ denotes sections of the etch mask 210 remaining in the ring-shaped trench, and reference character 53$_2$ denotes a filling material that completely fills the trench. Referring to FIG. 12I, the via insulation layer 5 includes sections of the insulation layer 50, as well as sections 53$_1$ of the etch mask 210 and the filling material 53$_2$. According to a further embodiment, the etch mask 210 completely fills the ring-shaped trench in those sections in which the gate electrode 21 does not extend through the trench. In this case, an additional filling process is not required.

Figure 13A:
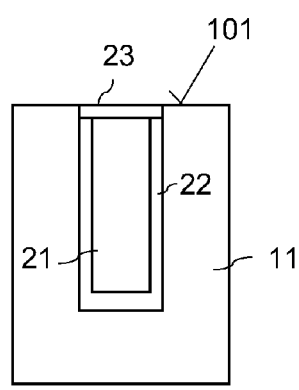
FIGS. 13A and 13B illustrates further method steps of the method according to FIGS. 12A to 12I.
Figure 13B:
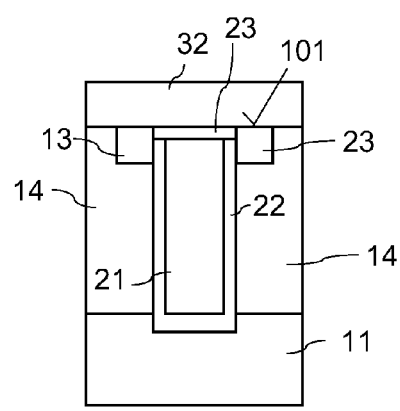

After forming the gate electrode 21 and before forming the source electrode 32, the source and body regions 13, 14 are produced. This is illustrated in FIGS. 13A and 13B, which each show a vertical cross sectional view in a section plane B-B through the gate electrode 21. FIG. 13A shows a vertical cross sectional view after the process steps illustrated in FIG. 12I. FIG. 13B shows the vertical cross sectional view after producing the source and body regions 13, 14 as well as the source electrode 32. Producing the source and body regions 13, 14 may, for example, include implantation and/or diffusion processes in which dopant atoms are introduced into the semiconductor body 100. After forming the source and body regions 13, 14 the source electrode 32 is formed on the first surface 101. The source electrode 32 is, for example, produced by depositing an electrode material, such as a metal or a polycrystalline semiconductor material.

FIGS. 14A to 14J illustrate a method for producing a trench transistor device that includes a gate electrode 21 and a field electrode 61 arranged in the same.

Figure 14A:
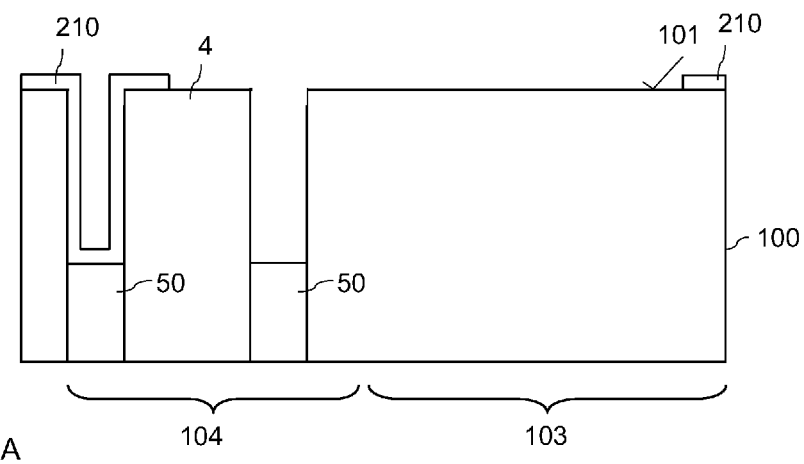
FIGS. 14A to 14J illustrates a method for producing a vertical transistor device.

As in the method illustrated in FIGS. 12A to 12C, at least one first trench 140 is formed to extend from the first surface 101 into the semiconductor body 100. Forming the at least one trench 140 includes employing an etch mask 210 that covers those regions of the semiconductor body 100 that are not to be etched. FIG. 14A illustrates a vertical cross sectional view of the semiconductor body 100 after forming the etch mask 210 and before etching the trench.

Figure 14B:
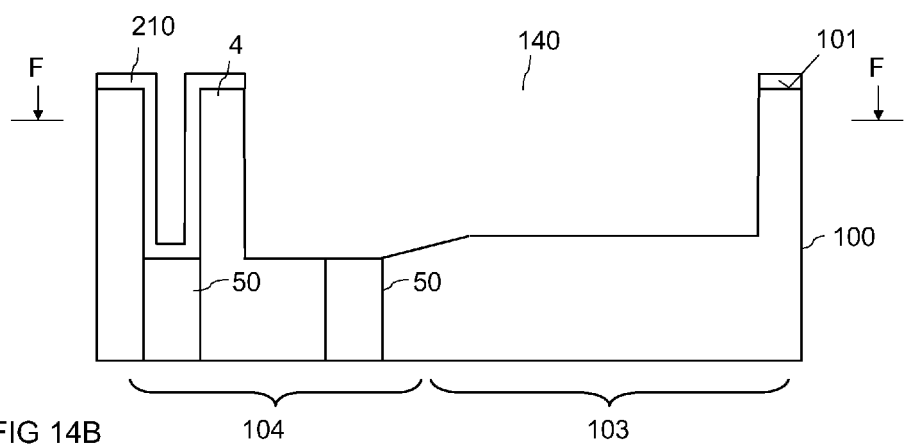
Figure 14C:
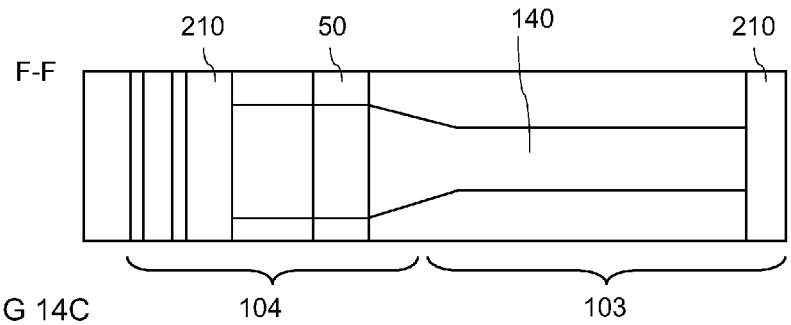

FIG. 14B shows a vertical cross sectional view of the semiconductor body 100 after forming the at least one trench 140, and FIG. 14C shows a horizontal cross sectional view in a section plane F-F after forming the at least one trench 140. Referring to FIG. 14C, the at least one trench 140 is formed such that it is wider in the gate connection region 104 than in the transistor cell region 103. This can be obtained by suitably defining the geometry of the etch mask 210. Forming the at least one trench 140 to be wider in the gate connection region 104 than in the transistor cell region 103 may also involve that the at least one trench 140 is deeper in the gate connection region 104 than in the transistor cell region 103. However, this is not required in order to obtain the desired transistor device.

Figure 14D:
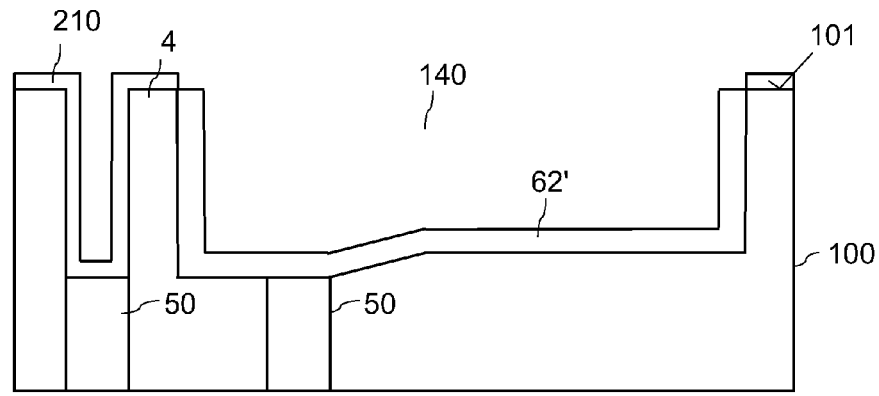

Referring to FIG. 14D, a first dielectric layer 62' is formed on the bottom and the sidewalls of the at least one trench 140. Sections of the first dielectric layer 62' form the field electrode dielectric 62 that dielectrically insulates the field electrode (61 in FIG. 7B) from the surrounding semiconductor regions of the semiconductor body 100.

Figure 14E:
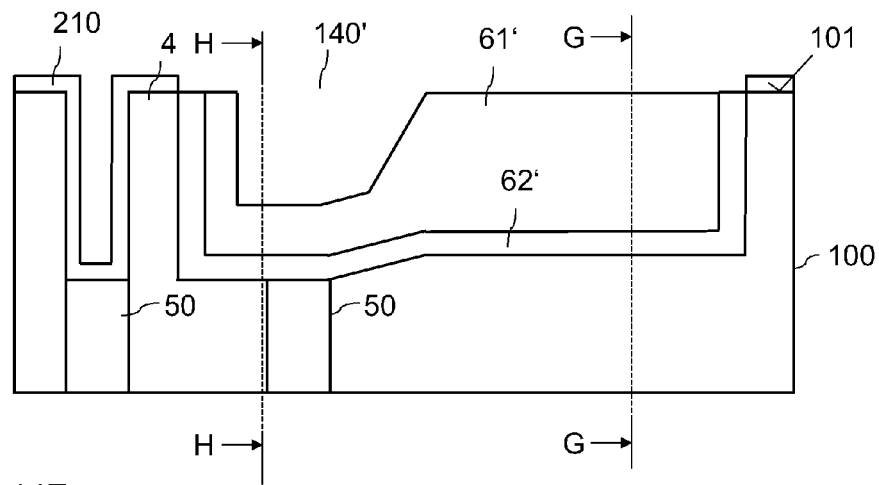
Figure 14F:
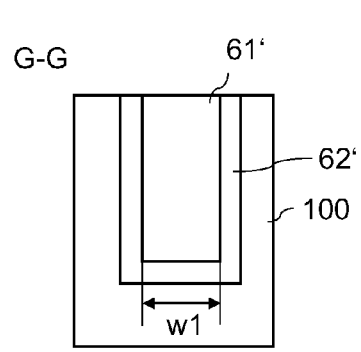
Figure 14G:
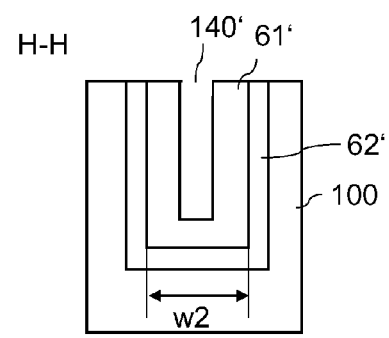

Referring to FIG. 14E, a first electrode layer 61' is deposited on the first dielectric layer 62' in the at least one trench 140. A layer thickness of the first electrode layer 61' is selected such that the first electrode layer 61' completely fills the at least one trench in the transistor cell region 103, where the trench is narrower, and only covers the bottom and the sidewalls of the at least one trench in the gate connection region 104, where the trench is wider, so as to leave a residual trench 140' in the gate connection region 104. This is illustrated in FIGS. 14F and 14G which show horizontal cross sectional views in sections planes G-G and H-H that extend through the trench with the first dielectric layer 62' and the first electrode layer 61' in the transistor cell region 103 and the gate connection region 104. Assume that w1 is the width of the trench 140 in the transistor cell region 103 after forming the first dielectric layer 62'. In this case, a thickness of the deposited first electrode layer 61' is more than 50% of trench width w1, but less than 50% of a trench width w2 of the wider trench section in the gate connection region 104.

Figure 14H:
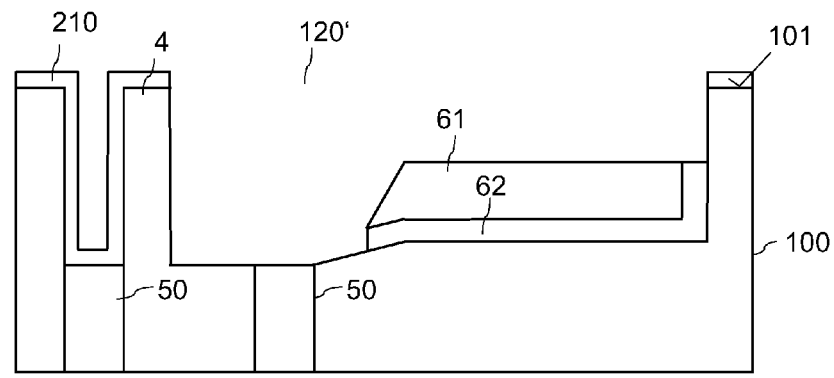

Referring to FIG. 14H, the first electrode layer 61' is then etched back using, for example, an isotropic etching process. However, an anisotropic etching process may be used as well. In this etching process the first electrode layer 61' is completely removed in the gate connection region 104, while in the transistor cell region 103, the first electrode layer 61' is only etched back down to below the first surface 101, so as to form the field electrode 61. In the following oxide etch process, the first dielectric layer 62' is removed in those sections that are uncovered after etching back the first electrode layer 61'. Removing the first dielectric layer 62' from these uncovered regions may, for example, include an isotropic or an anisotropic etching process.

Figure 14I:
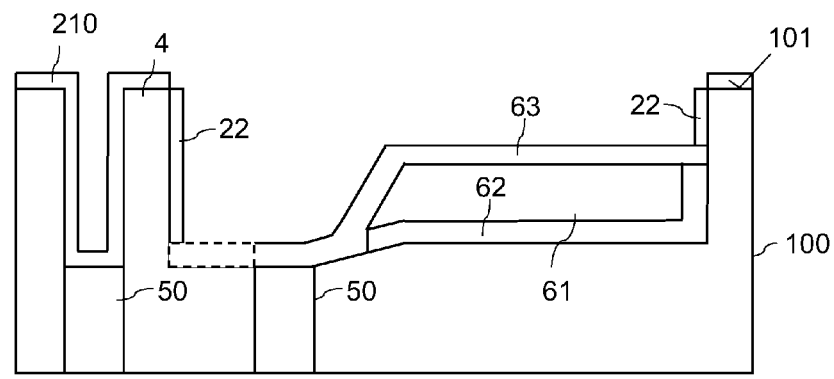

Referring to FIG. 14I, the inter-electrode dielectric 63 is formed on the field electrode 61. Forming the inter-electrode dielectric 63 may, for example, include a deposition process, such as a High Density Plasma (HDP) process. In this deposition process, the inter-electrode dielectric 63 is basically only deposited on horizontal surfaces, such as on the bottom of the trench and on the field electrode 61, but not on vertical surfaces, such as sidewalls of the trench 140. According to a further embodiment, a thermal oxidation process may be used that forms the inter-electrode dielectric 63 as well as oxide layers on the sidewalls. In the embodiment illustrated in FIG. 14I, the inter-electrode dielectric 63 is not only deposited on the field electrode 61 but also on those sections of the bottom of the at least one trench that are uncovered after removing the first dielectric layer 62'.

Further, the gate dielectric 22 is formed on sidewalls of the at least one trench 140 that remain after producing the field electrodes 61. Similar to the process steps explained with reference to FIGS. 12E and 12F, the gate dielectric 62 is removed from the sidewall 141 that adjoins the semiconductor via 4. The inter-electrode dielectric 63 may remain on the bottom region adjoining the semiconductor via 4 (as illustrated in dashed lines), but could also be removed by employing a suitable etching process. Optionally, dopant atoms can be implanted into the semiconductor via 4 in order to produce the higher doped region 42 shown in FIG. 14J.

Figure 14J:
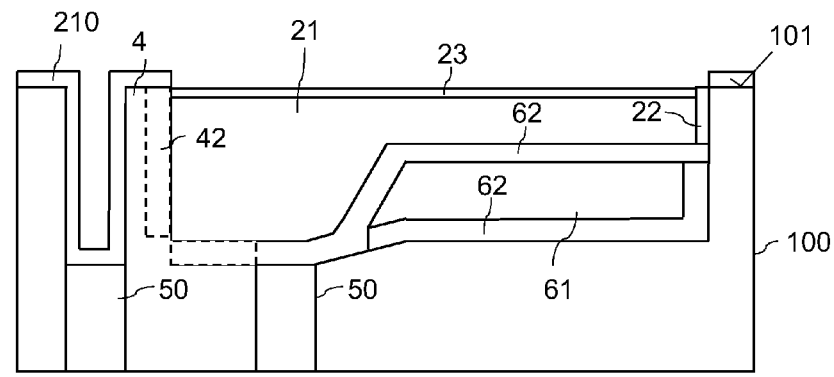

Referring to FIG. 14J, the gate electrode 21 and the insulation layer 23 on top of the gate electrode 21 are formed. The process steps for forming the gate electrode 21 and the insulation layer 23 may correspond to the process steps explained with reference to FIGS. 12G and 12H.

Figure 15:
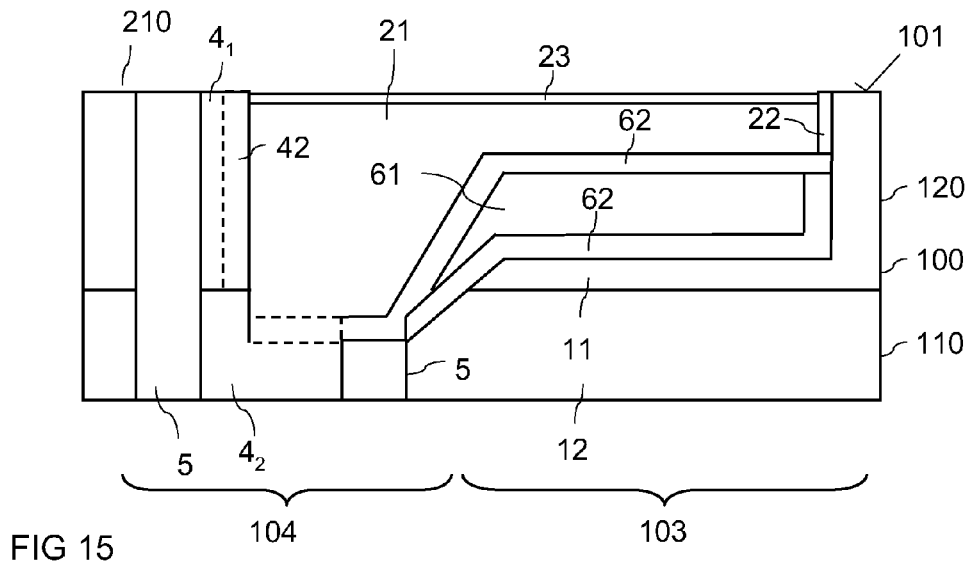
FIG. 15 illustrates a vertical cross sectional view of a transistor according to a further embodiment.

Referring to FIG. 15, which shows a vertical cross sectional view of a transistor component, the semiconductor body 100 may include a higher doped layer 110 and a lower doped layer 120, and the trench for implementing the field electrode 61 and the gate electrode 21 can be produced such that it extends into the higher doped layer 110 in the gate connection region 104, while it does not extend to the higher doped layer 120, that forms the drain region 12, in the transistor cell region 103. In this case, the gate electrode 21 is electrically connected to the gate connection electrode (not shown in FIG. 15) through the higher doped via region $4_2$.

Instead of providing the semiconductor body 100 with a higher doped layer and a lower doped layer, it is also possible to provide the semiconductor body 100 with a basic doping concentration that corresponds to the desired doping concentration of the drift region 11 and to form the drain region 12 by implanting and or diffusing dopant atoms via the second surface 102 into the semiconductor body 100.

Although embodiments of the present invention have been disclosed with reference to a transistor device that has a trench gate electrode connected to the semiconductor via, the invention is not restricted to be used in connection with a transistor device. Instead, a trench electrode arranged in the region of a first surface of a semiconductor body and connected to a semiconductor via extending through the semiconductor body may be employed in a plurality of other semiconductor devices as well.

Figure 16:
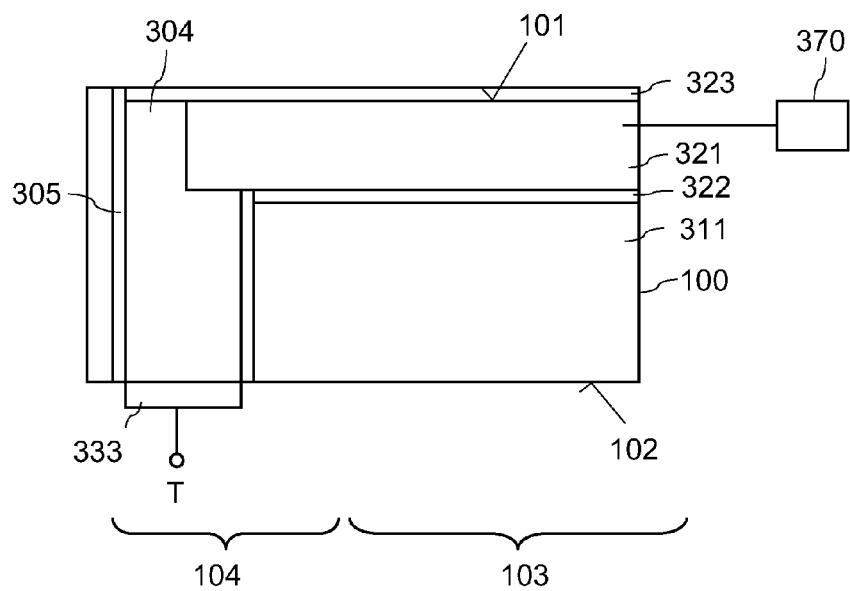
FIG. 16 illustrates a vertical cross sectional view of a semiconductor device including a trench electrode and a semiconductor via.

FIG. 16 illustrates a vertical cross sectional view of a semiconductor device including a semiconductor body 100 with a first surface 101 and a second surface 102 and with a semiconductor via 304 that extends in the semiconductor body 100 in a vertical direction to the second surface 102 where a contact electrode 333 is electrically connected to the semiconductor via 304. The semiconductor via 304 is electrically insulated from the semiconductor body 100 by an insulation layer 305. That which has been explained concerning the semiconductor via 4, the insulation layer 5, and the gate electrode 33 herein before applies to the semiconductor via 304, the insulation layer 305, and the contact electrode 333, respectively, accordingly. A trench electrode 321 arranged in a trench in the region of the first surface 101 of the semiconductor body 100 extends into the semiconductor via 304 and is electrically connected to the semiconductor via 304. The trench electrode is insulated from the semiconductor body 100 by an insulation layer 322. A further insulation layer 323 may be arranged on top of the trench electrode 323.

Referring to FIG. 16, the trench electrode 321 is electrically connected to a sensor 370 or other type of integrated circuitry integrated in the semiconductor body 100. This sensor or circuitry 370 is only schematically illustrated in FIG. 16. The sensor, is, for example a temperature sensor, an acceleration sensor, a current sensor, or the like. The trench electrode 321 is electrically connected to one terminal of the sensor 370, so as to electrically connect this terminal to the contact electrode 333. Several trench electrodes 321, several semiconductor vias 304 and several contact electrodes 333 that are electrically insulated from one another can be implemented in one semiconductor body in order to electrically contact several sensors or to contact two or more terminals of one sensor via the second surface. Further a trench transistor as explained with reference to FIGS. 1 to 15 before and a sensor or other circuitry may be implemented in one semiconductor body wherein the gate electrode of the transistor may be connected to a first semiconductor via, while the sensor may be connected to at least one second sensor.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific Figure may be combined with features of other Figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under", "below", "lower", "over", "upper" and the like, are used for ease of description to explain the positioning of one element relative to a second element. These terms are intended to encompass different orientations of the device in addition to different orientations than those depicted in the Figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor transistor device, comprising:
   a semiconductor body having a first surface and a second surface;
   at least one gate electrode arranged in at least one trench extending from the first surface into the semiconductor body;
   a semiconductor via extending in a vertical direction of the semiconductor body within the semiconductor body to the second surface, the semiconductor via being electrically insulated from the semiconductor body by a via insulation layer wherein the via insulation layer is perpendicular to the first surface; and
   wherein the at least one gate electrode extends in the semiconductor body in a first lateral direction of the semiconductor body toward the semiconductor via and through the via insulation layer into the semiconductor via, wherein the semiconductor via comprises the same crystalline structure and semiconductor material as the surrounding semiconductor body, wherein the at least one gate electrode comprises a material different from the semiconductor via material, or the at least one gate electrode comprises a crystalline structure different from the semiconductor via crystalline structure, wherein the semiconductor transistor device further comprises:

a source region, a body region, a drift region and a drain region, the body region being arranged between the source region and the drift region and the drift region being arranged between the body region and the drain region, wherein the source region, the body region, the drift region, and the drain region are arranged in the semiconductor body, wherein the source region and the drain region are spaced apart in the vertical direction of the semiconductor body;

a source electrode arranged on the first surface and electrically connected to the source region;

a drain electrode arranged on the second surface and electrically connected to the drain region; and a gate dielectric dielectrically insulating the at least one gate electrode from the source region and the body region.

2. The semiconductor transistor device of claim 1, wherein the drift region and the drain region have the same doping type.

3. The semiconductor transistor device of claim 1, wherein the drift region and the drain region have complementary doping types.

4. The semiconductor transistor device of claim 1, further comprising:

a field electrode arranged in the at least one trench below the at least one gate electrode with respect to the first surface and dielectrically insulated from the at least one gate electrode; and a field electrode dielectric dielectrically insulating the field electrode from the semiconductor body.

5. The semiconductor transistor device of claim 4, wherein the field electrode in the first lateral direction is arranged distant to the via insulation layer.

6. The semiconductor transistor device of claim 1, wherein the semiconductor via further comprises a contact region electrically contacted by the at least one gate electrode, the contact region having a higher doping concentration than regions of the semiconductor via adjoining the contact region.

7. The semiconductor transistor device of claim 1, further comprising a plurality of transistor cells, each cell comprising a source zone, a body zone and a gate electrode.

8. The semiconductor transistor device according to claim 1, wherein the at least one gate electrode is electrically connected to a sensor integrated in the semiconductor body in a region of the first surface.

9. The semiconductor transistor device of claim 8, wherein the sensor is one of a temperature sensor or a current sensor.

10. The semiconductor transistor device of claim 1, further comprising at least two gate electrodes and at least two semiconductor vias, each of the gate electrodes being connected to one of the semiconductor vias.

11. The semiconductor transistor device of claim 1, wherein the source electrode includes an electrode section extending through the source region and into the body region.

12. A semiconductor transistor device, comprising:

a semiconductor body having a first surface and a second surface;

at least one gate electrode arranged in at least one trench extending from the first surface into the semiconductor body;

a semiconductor via extending in a vertical direction of the semiconductor body within the semiconductor body to the second surface, the semiconductor via being electrically insulated from the semiconductor body by a via insulation layer wherein the via insulation layer is perpendicular to the first surface; and wherein the at least one gate electrode extends in the semiconductor body in a first lateral direction of the semiconductor body toward the semiconductor via and through the via insulation layer into the semiconductor via, wherein the semiconductor via comprises the same crystalline structure and semiconductor material as the surrounding semiconductor body, wherein the at least one gate electrode comprises a material different from the semiconductor via material, or the at least one gate electrode comprises a crystalline structure different from the semiconductor via crystalline structure, wherein the semiconductor body includes a semiconductor substrate and an epitaxial layer formed on the semiconductor substrate, wherein the semiconductor transistor device further comprises:

a source region, a body region, a drift region and a drain region, the body region being arranged between the source region and the drift region and the drift region being arranged between the body region and the drain region, wherein the source region, the body region, the drift region, and the drain region are arranged in the semiconductor body, wherein the source region and the drain region are spaced apart in the vertical direction of the semiconductor body;

a source electrode arranged on the first surface and electrically connected to the source region;

a drain electrode arranged on the second surface and electrically connected to the drain region; and a gate dielectric dielectrically insulating the at least one gate electrode from the source region and the body region.

* * * * *